(12) United States Patent
Hsu

(10) Patent No.: US 7,446,402 B2
(45) Date of Patent: Nov. 4, 2008

(54) SUBSTRATE STRUCTURE WITH EMBEDDED SEMICONDUCTOR CHIP AND FABRICATION METHOD THEREOF

(75) Inventor: Shih-Ping Hsu, Hsin-chu (TW)

(73) Assignee: Phoenix Precision Technology Corproation, Hsin-Chu (TW)

( * ) Notice: Subject to any disclaimer, the term of this patent is extended or adjusted under 35 U.S.C. 154(b) by 0 days.

(21) Appl. No.: 11/273,993

(22) Filed: Nov. 14, 2005

(65) Prior Publication Data

US 2006/0175692 A1  Aug. 10, 2006

(30) Foreign Application Priority Data

Feb. 4, 2005 (TW) .............................. 94103562 A

(51) Int. Cl.
*H01I 23/02* (2006.01)

(52) U.S. Cl. ................ 257/679; 438/121; 257/E23.064

(58) Field of Classification Search .................. 257/679, 257/E23.064
See application file for complete search history.

(56) References Cited

U.S. PATENT DOCUMENTS

| | | | |
|---|---|---|---|
| 6,081,997 A * | 7/2000 | Chia et al. .................... 29/841 |
| 6,709,898 B1 | 3/2004 | Ma et al. | |
| 6,872,597 B2 * | 3/2005 | Takahashi et al. ............ 438/114 |
| 6,952,049 B1 * | 10/2005 | Ogawa et al. ................ 257/700 |
| 7,087,991 B2 * | 8/2006 | Chen et al. ................... 257/700 |
| 2003/0227077 A1 * | 12/2003 | Towle et al. ................. 257/678 |
| 2004/0168825 A1 * | 9/2004 | Sakamoto et al. ........... 174/260 |
| 2005/0098879 A1 * | 5/2005 | Kim ........................... 257/712 |

\* cited by examiner

*Primary Examiner*—Leonardo Andujar
*Assistant Examiner*—Krista Soderholm
(74) *Attorney, Agent, or Firm*—Sawyer Law Group LLP

(57) ABSTRACT

A substrate structure with embedded semiconductor chip and a fabrication method thereof are provided. The method includes: providing a carrier board having a first surface and an opposing second surface, wherein a first opening and an opposing second opening are formed in the first and second surfaces respectively, and a portion of the first opening communicates with the second opening; mounting at least one semiconductor chip to bottom of the first opening to be received in the first opening; filling an adhesive material in the first and second openings and in a gap between the chip and the carrier board to adhere the chip; forming a dielectric layer on the carrier board and the chip; and forming a circuit layer on the dielectric layer and forming conductive structures in the dielectric layer, so that the circuit layer is electrically connected to the chip via the conductive structures.

12 Claims, 7 Drawing Sheets

SUBSTRATE STRUCTURE WITH EMBEDDED SEMICONDUCTOR CHIP AND FABRICATION METHOD THEREOF

FIELD OF THE INVENTION

The present invention relates to a structure and fabrication method of a semiconductor package, particularly, and more specifically, to a package structure and fabrication method of substrate with embedded semiconductor chip.

BACKGROUND OF THE INVENTION

With the development of semiconductor package technology, various package types are developed for semiconductor devices, wherein a semiconductor chip is firstly mounted on a package substrate or a conductive wire frame, the semiconductor chip is electrically connected to the package substrate of the conductive wire frame, and then an encapsulant is employed to encapsulate. Ball grid array (BGA) is an advanced semiconductor package technology, whose feature is to employ a package substrate to mount the semiconductor chip, wherein self-alignment technology is employed to mount a plurality of solder balls to the back surface of the package substrate, so as to accommodate more I/O connections on a semiconductor chip carrier board having a same area for meeting the requirement of high integration of the semiconductor chip. The solder balls are used to solder and electrically connect the whole package unit to external devices.

However, current BGA structure can not meet the electrical and heat spreading requirements under the circumstances of more pins (1500 pin) and high frequency (5 GHz). FCBGA structure can be used in products having said more pins and high frequency, however, whose package cost is high, and there are many limitations in this technology, especially in the electrically connecting portion thereof, for the sake of environment protection, electrically connecting materials, such as Pb, one of the solder materials, are forbidden to be used, electrical, mechanical qualities are unstable while using other replacement materials.

For this reason, a new method of a semiconductor chip is embedded in a semiconductor chip carrier board is proposed. As shown in FIG. 1, U.S. Pat. No. 6,709,898 discloses a semiconductor package having heat spreading function. As shown in the figure, the semiconductor package comprises a heat spreader 102, the heat spreader 102 comprises at least one recess 104; a semiconductor chip 114, a non-active surface 114B of the semiconductor chip 114 is mounted in the recess 104 via a thermally conductive adhesive material 118; a circuit build-up structure 122 formed on the heat spreader 102 and the semiconductor chip 114 via circuit build-up technology.

Referring to FIG. 2, a section view showing the spreader mounted in the semiconductor package. As shown in the figure, the recess 104 is extended to a certain depth from the upper surface of the heat spreader 102 to the inner thereof; the semiconductor chip 114 is mounted on the bottom surface of the recess 104 via the thermally conductive adhesive material 118; when the adhesive material is filled in the recess 104, it can not be fully filled in the space of the recess 104 because of the surface tension of the adhesive material per se, which may easily form voids 130. In the following fabricating procedure of the semiconductor package, when the semiconductor package having voids 130 is placed in the high temperature environment, the air in the voids 130 is expanded because of the heat, therefore resulting popcorn problem which degrades the reliability and quality of products.

SUMMARY OF THE INVENTION

Regarding the drawbacks of the above mentioned conventional technologies, the primary objective of the present invention is to provide a structure and fabrication method of substrate with embedded semiconductor chip for effectively promoting the quality and reliability of the semiconductor package structure.

Another objective of the present invention is to provide a structure and fabrication method of substrate with embedded semiconductor chip, so that the semiconductor chip can be effectively embedded in an adhesive material in the semiconductor package structure with embedded semiconductor chip for preventing from forming holes around the semiconductor chip so as to affect the reliability of following fabricating processes.

In accordance with the above and other objectives, the present invention proposes a structure and fabrication method of substrate with embedded semiconductor chip, comprising: providing a carrier board having a first surface and an opposing second surface, a first and a second opposing openings defined in the first and second surfaces, and a portion of the first opening communicating with the second opening; mounting at least one semiconductor chip to a bottom of the first opening to be received in the first opening; filling an adhesive material in the first and second openings, and in gaps between the semiconductor chip and the carrier board for adhering the semiconductor chip; forming a dielectric layer on the carrier board and the semiconductor chip; and forming a circuit layer on the dielectric layer, forming conductive structures in the dielectric layer, so that the circuit layer can be electrically connected to the semiconductor chip via the conductive structures. In addition, a circuit build-up structure can be further formed on the circuit layer via circuit build-up fabricating procedure, and a solder mask and be formed on the surface of the circuit build-up structure; a plurality of openings are defined in the solder mask for exposing the outer circuit portion of the circuit build-up structure, for forming a plurality of conductive structures such as solder balls or metal bumps to electrically connect the semiconductor chip embedded in the carrier board to external devices.

According to the above fabrication method, the present invention also proposes a structure of substrate with embedded semiconductor chip, comprising: a carrier board having a first and an opposing second surface, a first and second opposing openings defined in the first and second surfaces, and a portion of the first opening communicating with the second opening; at least one semiconductor chip mounted on a bottom of the first opening of the carrier board; an adhesive material filled in the first and second openings, and in the gaps between the semiconductor chip and the carrier board for adhering the semiconductor chip; a dielectric layer formed on the carrier board and the semiconductor chip; and a circuit layer formed on the dielectric layer, and the circuit layer electrically connected to the semiconductor chip via conductive structures running through the dielectric layer. On the basis of the above main structure, a circuit build-up structure can be formed on the dielectric layer and the circuit layer via a circuit build-up fabricating procedure, and a solder mask can be formed on the circuit build-up structure, the solder mask defines a plurality of openings for exposing the connecting pads of the circuit build-up structure; conductive structures such as solder balls or metal bumps can be formed in the opening to electrically connect the semiconductor chip embedded in the carrier board to external devices.

In the structure and fabrication method of substrate with embedded semiconductor chip of the present invention, the size of the opening of the first surface of the carrier board is greater than the size of the to-be-embedded semiconductor chip, and only a portion of the opening of the first surface communicates with the opening of the second surface, so that the first opening forms a mounting surface to mount the semiconductor chip, for an adhesive material passing from the second opening, through communicative area formed by first and second openings, and to the first opening, the adhesive material is thus effectively distributed and filled around the semiconductor chip for promoting the quality and reliability of following fabricating processes.

DETAILED DESCRIPTION OF THE PREFERRED EMBODIMENTS

The following embodiments are used to describe the present invention; those skilled in the art can easily understand other advantages and functions of the present invention via the contents disclosed in the description. Various embodiments can be employed in the present invention; and the detail of the description can be based on and employed in various points of view, which can be modified within the scope of the present invention.

FIG. 3A to FIG. 3H are flow charts showing the fabrication method of the semiconductor package of the present invention.

Figure 1:
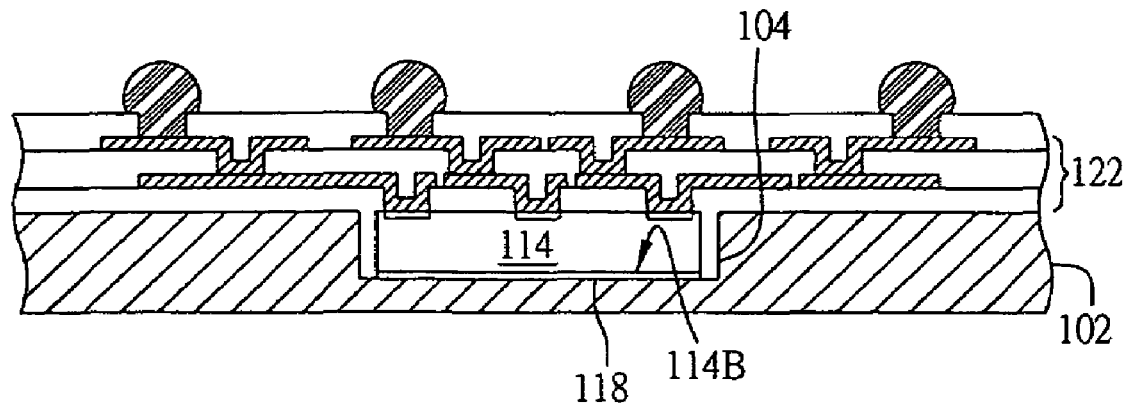
FIG. 1 is a schematic section view of the semiconductor package structure of U.S. Pat. No. 6,709,898.
Figure 2:
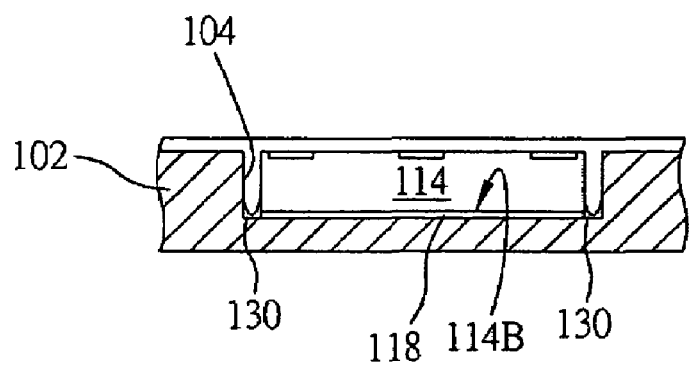
FIG. 2 is a schematic section view of an embodiment of U.S. Pat. No. 6,709,898, showing voids are formed because a dielectric layer can not be fully filled in the space between a semiconductor chip and a carrier board.
Figure 3A:
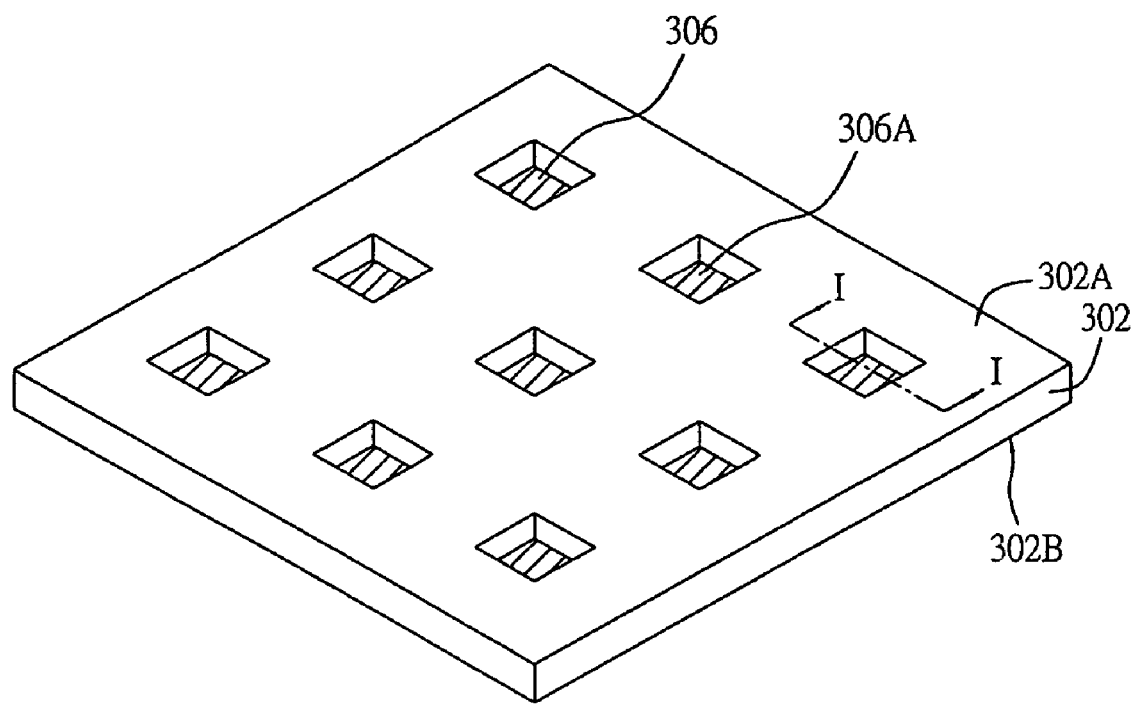
FIG. 3A to FIG. 3I are schematic views showing the fabrication method of the semiconductor package of the present invention.
Figure 3B:
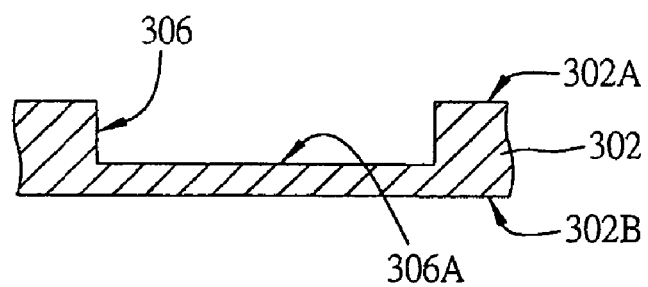

Firstly, referring to FIG. 3A, a carrier board 302 having a first surface 302A and a second surface 302B is provided, a first opening 306 having a predetermined depth while not running through the carrier board 302 is defined in the first surface 302A of the carrier board 302. FIG. 3B is a section view along I-I line cutting the carrier board 302 having the first opening 306, wherein a mounting surface 306A is formed on a bottom corresponding to the first opening 306.

Figure 3C:
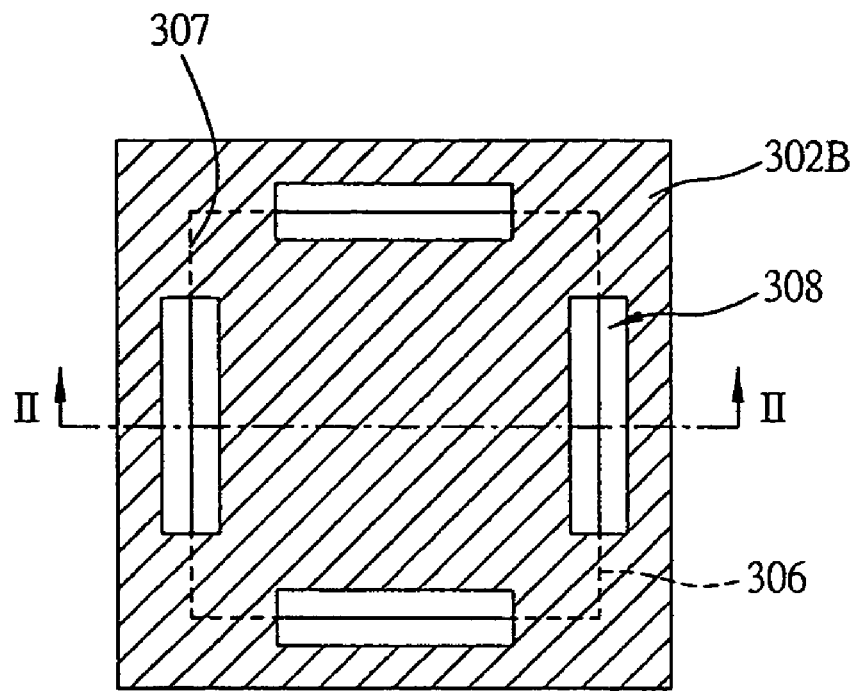
Figure 3C:
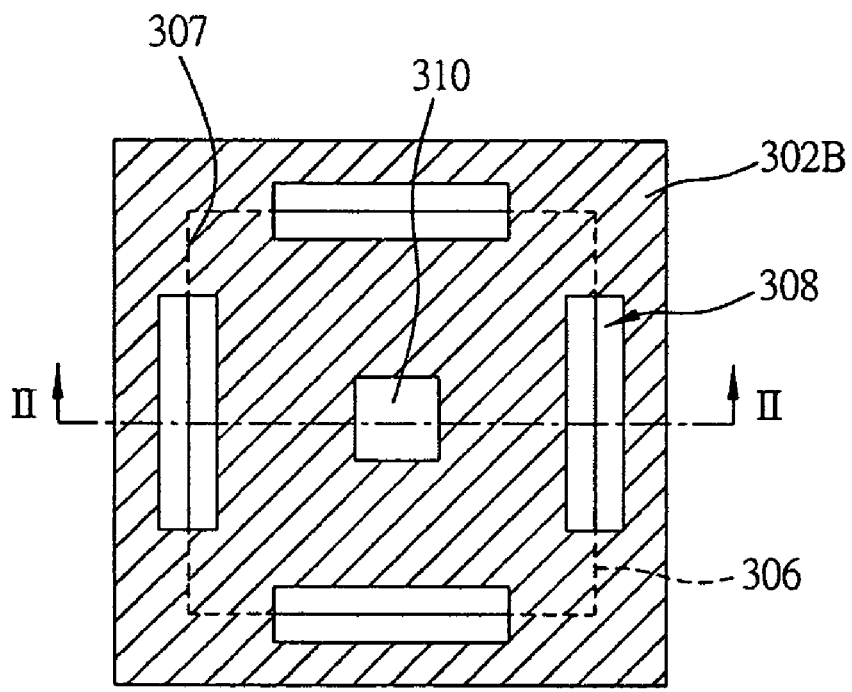

Next, referring to FIG. 3C, a second opening 308 is defined in the second surface 302B of the carrier board 302, wherein a portion of the second opening 308 is in the range of the first opening 306, so that a portion of the first opening 306 can communicate with the second opening 308. That is, the depth of the second opening 308 of the second surface 302B of the carrier board 302 reaches the bottom mounting surface 306A of the first opening 306, so that portions of the first and second openings 306, 308 of the carrier board 302 are communicative with each other, wherein the first and second openings 306, 308 are defined via etching.

Moreover, as shown in FIG. 3C', at least one third opening 310 can be formed on the second surface 302B of the carrier board 302 and extended to the bottom mounting surface 306A of the first opening 306, such that a semiconductor chip subsequently mounted on the bottom mounting surface 306A can be exposed via the third opening 310.

The carrier board structure having the openings can also be formed via electroplating technique or laminating two metal plates with the first and second openings. Thereof, the carrier board 302 is a metal board that can be used for the heat dissipating of semiconductor chip. The fabrication method of the carrier board having the opening is known to those skilled in the art, which will not be detailed hereinafter.

Figure 3D:
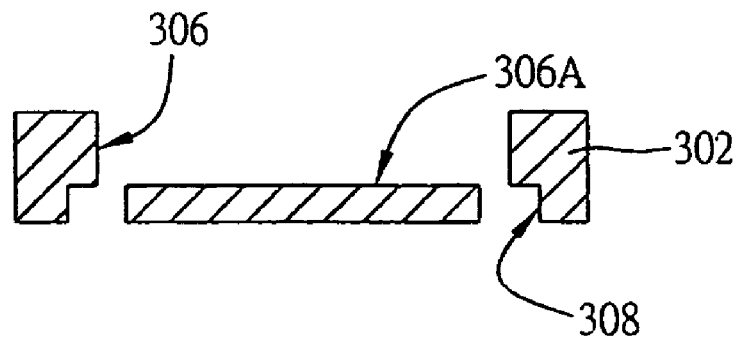

A section view as shown in FIG. 3D can be achieved along the II-II line of FIG. 3C. It is to be noted that, in practical fabricating procedure, it is not exclusive that firstly defining the first opening 306 and then defining the second opening 308, the second opening 308 can also be defined firstly, and the first opening 306 is defined subsequently. The carrier board 302 having the first and second openings 306, 308 can be formed via other methods, as long as portions of the first opening 306 and second opening 308 are communicative with each other, and the communicative area is preferably to be around the first opening 306. The individual depth of the first opening 306 and the second opening 308 do not run through the carrier board 302, and the first opening 306 and second opening 308 are defined not only by means of etching.

Figure 3E:
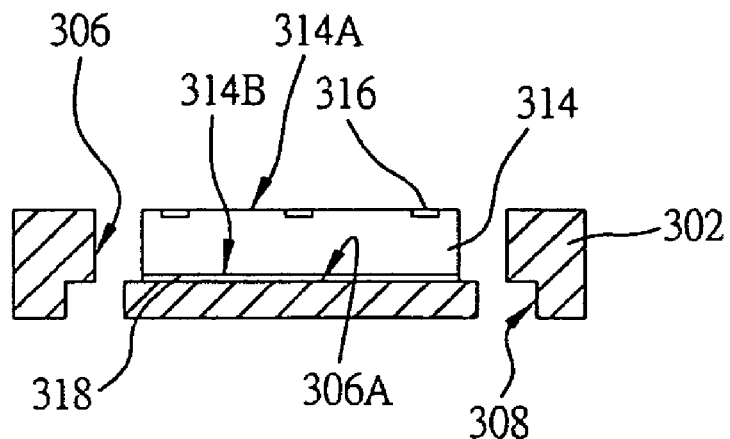

Referring to FIG. 3E, after the carrier board 302 having the first and second openings 306, 308 is formed, a non-active surface 314B of at least one semiconductor chip 314 is mounted on the mounting surface 306A at the bottom of the first opening 306 of the carrier board 302 via a thermally conductive adhesive material 318, wherein an active surface 314A of the semiconductor chip 314 comprises a plurality of electrically connecting pads 316.

Figure 3F:
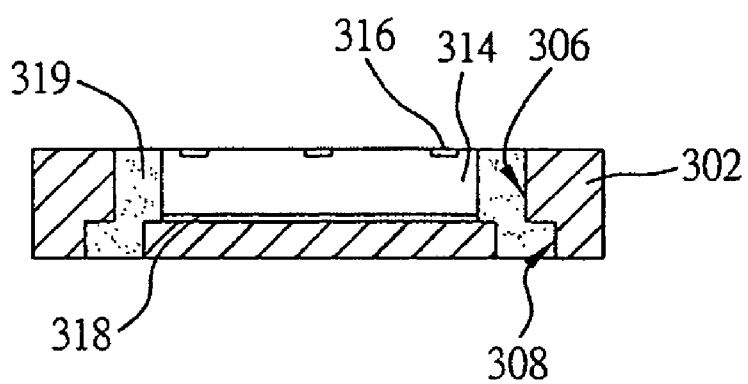

Referring to FIG. 3F, an adhesive material 319 is filled in the first and second openings 306, 308, and in the gaps between the semiconductor chip 304 and the carrier board 302, the adhesive material 319 is further effectively distributed and filled around the semiconductor chip 314, so that a dielectric layer 310 effectively covers the semiconductor chip 314 to promote the quality and reliability of the following fabricating processes.

Figure 3G:
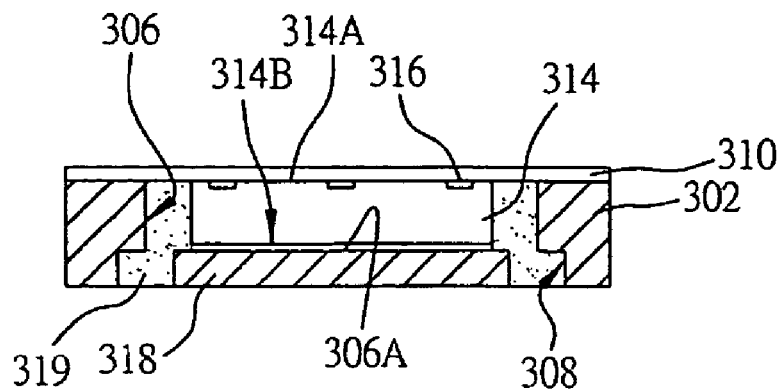

Referring to FIG. 3G, a dielectric layer 310 is formed on the carrier board 302 and the semiconductor chip 314.

Figure 3H:
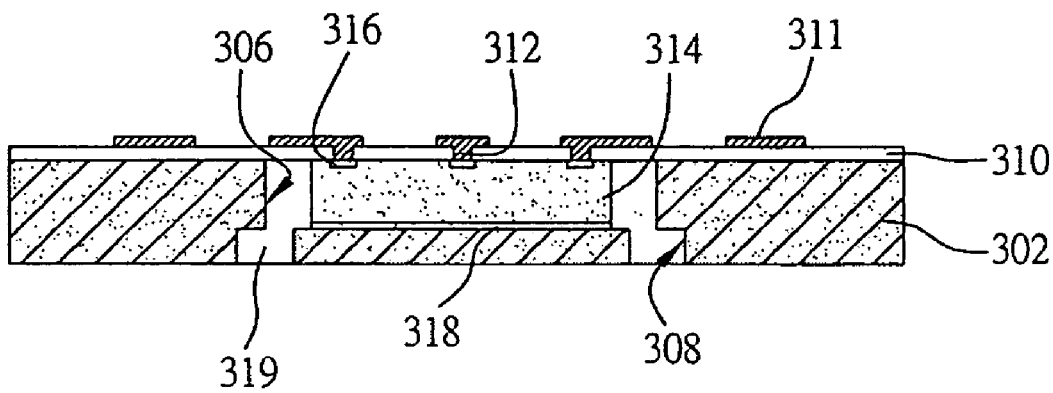

Referring to FIG. 3H, a plurality of openings is defined in the dielectric layer 310, and at least one portion of the openings are located opposing the electrically connecting pads 316 of the semiconductor chip 314 so as to expose the electrically connecting pads 316, which is used in forming a circuit layer 311 on the dielectric layer 310 via circuit patterning procedure wherein conductive structures 312 (such as conductive vias or conductive bumps) are formed on the dielectric layer 310, so that the circuit layer 311 can be electrically connected to the electrically connecting pads 316 of the semiconductor chip 314 via the conductive structures 312, and the semiconductor chip can thus be electrically connected to external devices directly.

Figure 3I:
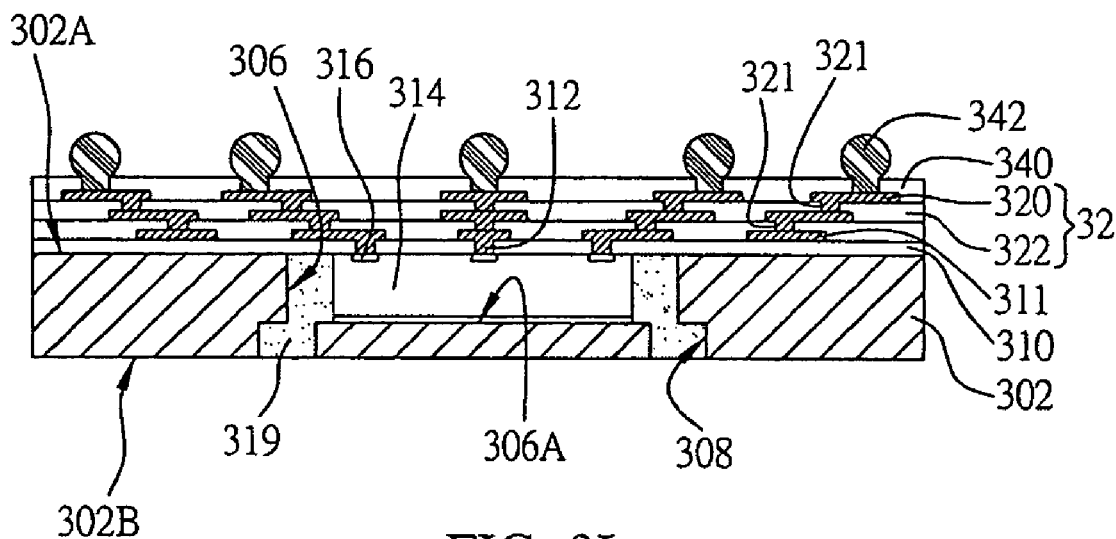
Figure 3I:
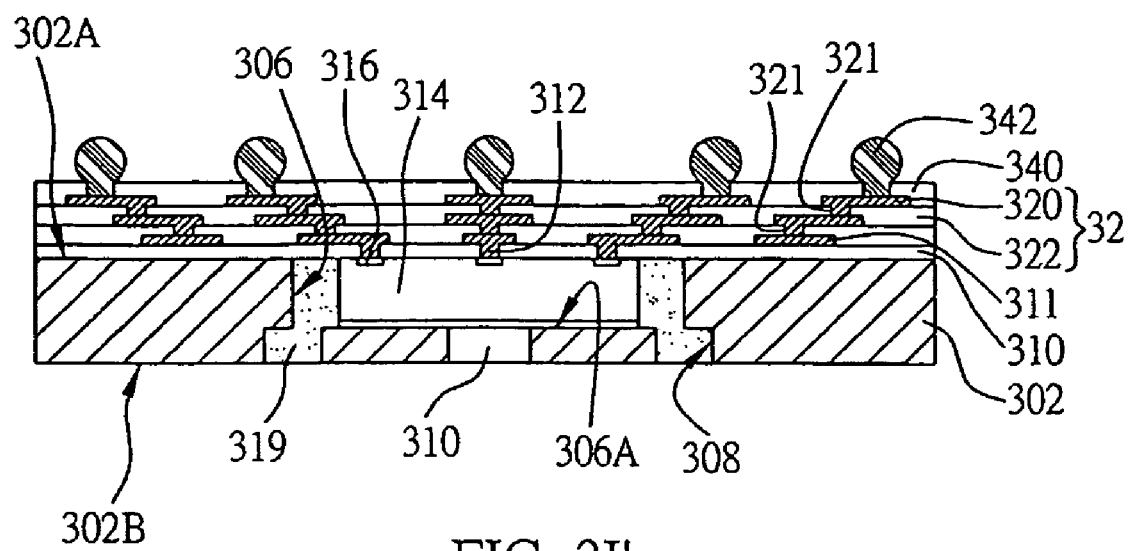

Referring FIG. 3I, circuit build-up procedure can be further performed, so as to form a circuit build-up structure 32 on the dielectric layer 310 and the circuit layer 311, wherein the circuit build-up structure 32 comprises dielectric layer 322, a circuit layer 320 formed on the dielectric layer 322, and conductive vias 321 defined in the dielectric layer 322 serving as interlayer electrically connecting members for the circuit layer 320. A solder mask 340 can be further formed on the surface of the circuit build-up structure 32, and a plurality of openings can be defined in the solder mask 340 for exposing the outer circuit portion of the circuit build-up structure 32, therefore forming a plurality of conductive members such as solder balls or metal bumps for electrically connecting the semiconductor chip 314 embedded in the carrier board 302 to external devices.

Moreover, as shown in FIG. 3I', at least one third opening 310 can be formed on the second surface 302B of the carrier board 302 and extended to the bottom mounting surface 306A of the first opening 306, such that the semiconductor chip 314 mounted on the bottom mounting surface 306A is exposed via the third opening 310.

According to the above fabricating procedure, the present invention also discloses a semiconductor package structure, the structure mainly comprises: a carrier board 302 having a first surface 302A and an opposing second surface 302B, a first and second opposing openings 306, 308 defined in the first and second surfaces 302A, 302B so that a portion of the first opening 306 can communicate with the second opening 308; at least one semiconductor chip 314 mounted on the bottom mounting surface 306A of the first opening 306 of the carrier board 302; an adhesive material 319 filled in the first and second openings 306, 308, and in the gaps between the semiconductor chip 314 and the carrier board 302, for adhering the semiconductor chip 314; a dielectric layer 310 formed on the carrier board 302 and the semiconductor chip 314; and a circuit layer 311 formed on the dielectric layer 310, the circuit layer 311 electrically connected to the semiconductor chip 314 via conductive structures 312 running through the dielectric layer 310. A non-active surface 314B of the semiconductor chip 314 is mounted on the mounting surface 306A at the bottom of the first opening 306 via a thermally conductive adhesive material 318, and an active surface 314A of the semiconductor chip 314 comprises a plurality of electrically connecting pads 316 for electrically connected to the conductive structures 312 and the circuit layer 311. Furthermore, a circuit build-up structure 32 can be formed on the dielectric layer 310 and the circuit layer 311 via a circuit build-up fabricating procedure; in addition, a solder mask 340 can be formed on the circuit build-up structure 32, the solder mask comprises a plurality of openings for forming conductive members such as solder balls 342 or metal bumps for electrically connecting the semiconductor chip 314 to external devices.

Additionally, the first and second openings 306, 308 of the carrier board 302 can be rectangular, circular, elliptical or any other shape, as long as the a portion of the first opening 306 communicates with the second opening 306, so that the first opening 306 forms a mounting surface 306A to mount the semiconductor chip 314, for an adhesive material 319 passing from the second opening 308, through communicative area formed by first and second openings 306, 308, and to the first opening 306, the adhesive material 319 is thus effectively distributed and filled around the semiconductor chip 314 for promoting the quality and reliability of following fabricating processes.

Figure 4:
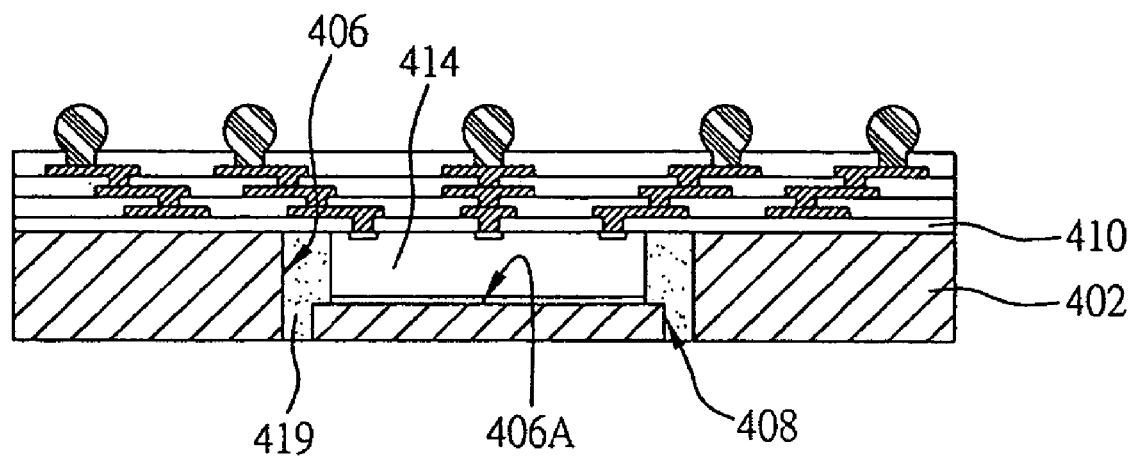
FIG. 4 is a schematic view showing an alternative embodiment of the semiconductor package of the present invention.

Referring also to FIG. 4, a schematic section view of an alternative embodiment of the semiconductor package structure of the present invention is shown. As illustrated in the figure, the present embodiment is similar to the above embodiment, while mainly different in that, the second opening 408 of the carrier board 402 is defined at the edge of the first opening 406, so that the edges of the first and second openings 406, 408 are aligned to fully expose the second opening 408 out of the first opening 406, that is, the communicative area formed by the first and second openings 406, 408 is at the position of the second opening 408. However, only a portion of the first opening 406 communicates with the second opening 408, the individual depth of the first opening 406 and the second opening 408 does not run through the carrier board 402, so that the first opening 406 forms a mounting surface 406A at the bottom thereof to mount the semiconductor chip 414, for the adhesive material 419 passing from the second opening 408 to the first opening 406, the adhesive material 419 is thus effectively distributed and filled around the semiconductor chip 414 for promoting the quality and reliability of following fabricating processes.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following appended claims.

What is claimed is:

1. A fabrication method of substrate structure with embedded semiconductor chip, comprising the steps of:

providing a metal carrier board having a first surface and an opposing second surface, wherein a first opening and a plurality of opposing second openings are formed in the first surface and the second surface respectively, the first opening and the second openings not penetrating through the carrier board, the second openings being located at the periphery of the first opening, a portion of the first opening communicating with the second openings, and a mounting surface of the carrier board being formed on a bottom corresponding to the first opening;

mounting at least a semiconductor chip having a non-active surface and an active surface on the mounting surface of the carrier board exposed out of the first opening of the carrier board via a thermally conductive adhesive material adhered with the non-active surface of the semiconductor chip;

filling an adhesive material in the first and second openings and in a gap between the semiconductor chip and the carrier board to adhere to the semiconductor chip;

forming a first dielectric layer on the carrier board and the semiconductor chip; and forming a first circuit layer on the first dielectric layer, and forming conductive structures in the first dielectric layer, such that the first circuit layer is electrically connected to the semiconductor chip via the conductive structures.

2. The fabrication method of claim 1, further comprising forming at least one third opening on the second surface of the carrier board, the third opening being extended to the bottom of the first opening such that the semiconductor chip mounted to the bottom of the first opening is exposed via the third opening.

3. The fabrication method of claim 1, further comprising forming a circuit build-up structure on the dielectric layer and the circuit layer.

4. The fabrication method of claim 3, wherein the circuit build-up structure comprises a second dielectric layer, a second circuit layer formed on the first dielectric layer, and conductive vias formed in the second dielectric layer to provide interlayer electrical connection for the first circuit layer.

5. The fabrication method of claim 1, wherein the first opening only has a portion communicating with the second openings, such that a mounting surface is formed at the bottom of the first opening to mount the semiconductor chip, allowing the adhesive material to enter the first opening from the second openings through the portion of the first opening communicating with the second openings and to be effectively distributed and filled around the semiconductor chip.

6. The fabrication method of claim 1, wherein an active surface of the semiconductor chip comprises electrically connecting pads being electrically connected to the conductive structures and the first circuit layer.

7. A substrate structure with embedded semiconductor chip, comprising:
- a metal carrier board having a first surface and an opposing second surface, the first surface and the second surface having a first opening and a plurality of opposing second openings respectively, the first opening and second openings not penetrating through the carrier board, the second openings being located at the periphery of the first opening, a portion of the first opening communicating with the second openings, and a mounting surface of the carrier board being formed on a bottom corresponding to the first opening;
- at least a semiconductor chip having a non-active surface and an active surface, wherein the semiconductor chip is mounted on the mounting surface of the carrier board exposed out of the first opening of the carrier board via a thermally conductive adhesive material adhered with the non-active surface of the semiconductor chip;
- an adhesive material filled in the first and second openings and in a gap between the semiconductor chip and the carrier board to adhere to the semiconductor chip;
- a first dielectric layer formed on the carrier board and the semiconductor chip; and
- a first circuit layer formed on the first dielectric layer, and electrically connected to the active surface of the semiconductor chip via conductive structures penetratingly formed in the first dielectric layer.

8. The substrate structure of claim 7, further comprising a circuit build-up structure formed on the dielectric layer and the circuit layer.

9. The substrate structure of claim 8, wherein the circuit build-up structure comprises a second dielectric layer, a second circuit layer formed on the first dielectric layer, and conductive vias formed in the second dielectric layer to provide interlayer electrical connection for the first circuit layer.

10. The substrate structure of claim 7, wherein the first opening and the second openings do not penetrate through the carrier board.

11. The substrate structure of claim 7, wherein an active surface of the semiconductor chip comprises electrically connecting pads being electrically connected to the conductive structures and the circuit layer.

12. The substrate structure of claim 7, further comprising: at least one third opening formed on the second surface of the carrier board, the third opening being extended to the bottom of the first opening such that the semiconductor chip mounted to the bottom of the first opening is exposed via the third opening.

* * * * *